United States Patent
Heerens et al.

(10) Patent No.: US 6,753,945 B2
(45) Date of Patent: Jun. 22, 2004

(54) TRANSFER METHOD FOR A MASK OR SUBSTRATE, STORAGE BOX, APPARATUS ADAPTED FOR USE IN SUCH METHOD, AND DEVICE MANUFACTURING METHOD INCLUDING SUCH A TRANSFER METHOD

(75) Inventors: Gert-Jan Heerens, Schoonhoven (NL); Bastiaan Lambertus Wilhelmus Marinus Van De Ven, 's-Hertogenbosch (NL); Robert Gabriel Maria Lansbergen, Schiedam (NL); Erik Leonardus Ham, Rotterdam (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/374,511

(22) Filed: Feb. 27, 2003

(65) Prior Publication Data

US 2003/0224295 A1 Dec. 4, 2003

(30) Foreign Application Priority Data

Mar. 1, 2002 (EP) .......................................... 02075883

(51) Int. Cl.⁷ ........................ G03B 27/42; G03B 27/58; G65G 49/07
(52) U.S. Cl. ............................ 355/53; 355/72; 414/939
(58) Field of Search ............................. 355/53, 72, 75; 414/217, 418, 935, 937, 939, 940

(56) References Cited

U.S. PATENT DOCUMENTS 5,547,328 A  8/1996  Bonora et al.
5,559,584 A  9/1996  Miyaji et al.
6,427,096 B1 * 7/2002  Lewis et al. ................. 700/228
2002/0005939 A1 * 1/2002  Cuijpers et al. .............. 355/53

FOREIGN PATENT DOCUMENTS

| EP | 0 358 443 A3 | 3/1990 |
| EP | 0 358 443 A2 | 3/1990 |
| JP | 2001-76998 | 3/2001 |
| WO | WO 01/73825 | 3/2001 |

* cited by examiner

*Primary Examiner*—Alan Mathews
(74) *Attorney, Agent, or Firm*—Pillsbury Winthrop LLP

(57) ABSTRACT

A method for transferring one or more substrates or masks in a storage box to an apparatus for handling, processing or using the substrates or masks or vice versa, the storage box including a cover having an openable cover part. The method includes providing the storage box onto an openable wall part of a wall of an enclosed protective environment of the apparatus such that the openable cover part overlaps the openable wall part, the protective environment being adapted to be filled with an inert gas or to be evacuated; opening the openable cover part and the openable wall part, whereby the cover of the storage box forms part of the wall of the protective environment and an inside of the storage box becomes part of the protective environment; and transferring at least one of the substrates or masks from an inside space of the storage box to an inside space of the protective environment, or vice versa.

15 Claims, 2 Drawing Sheets

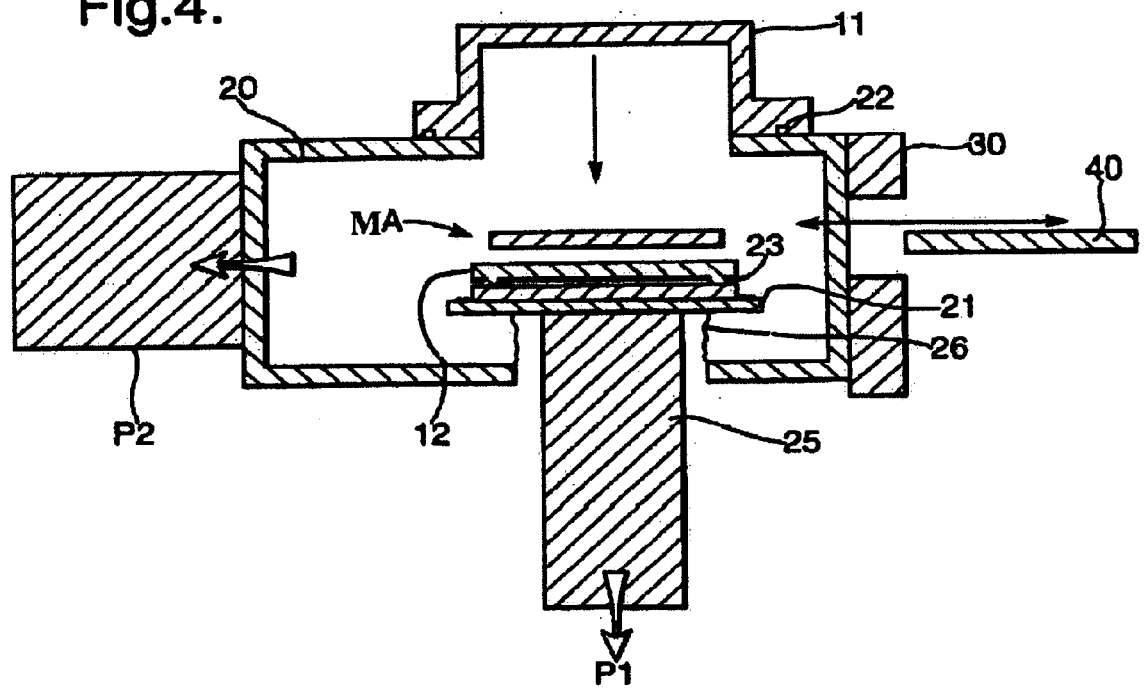
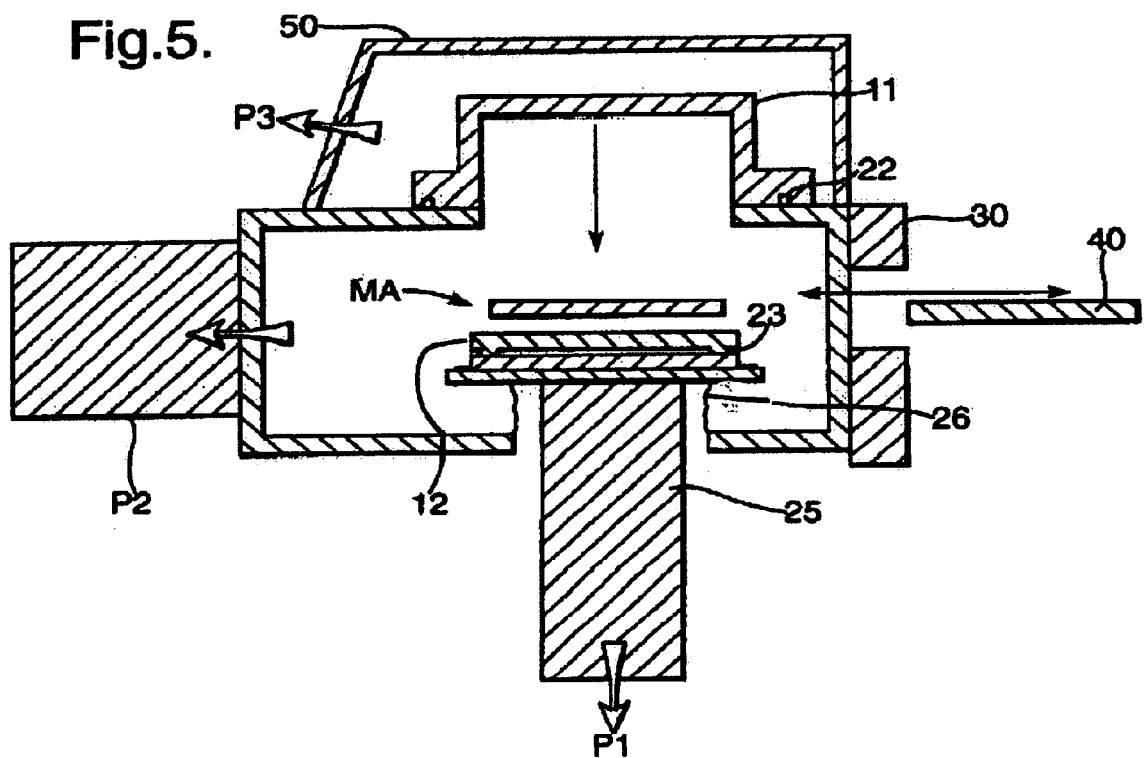

TRANSFER METHOD FOR A MASK OR SUBSTRATE, STORAGE BOX, APPARATUS ADAPTED FOR USE IN SUCH METHOD, AND DEVICE MANUFACTURING METHOD INCLUDING SUCH A TRANSFER METHOD

BACKGROUND OF THE INVENTION

1. Field of the Invention

The present invention relates to a method of transferring a substrate or mask or mask suitable for patterning a projection beam of extreme ultraviolet electromagnetic radiation, a storage box, and an apparatus adapted for use in such a method.

2. Description of the Related Art

Lithographic projection apparatus can be used, for example, in the manufacture of integrated circuits (ICs). In such a case, the patterning device may generate a circuit pattern corresponding to an individual layer of the IC, and this pattern can be imaged, onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as here described can be seen, for example, from U.S. Pat. No. 6,046,792.

In a known manufacturing process using a lithographic projection apparatus, a pattern (e.g. in a mask) is imaged onto a substrate that is at least partially covered by a layer of radiation-sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. It is important to ensure that the overlay (juxtaposition) of the various stacked layers is as accurate as possible. For this purpose, a small reference mark is provided at one or more positions on the wafer, thus defining the origin of a coordinate system on the wafer. Using optical and electronic devices in combination with the substrate holder positioning device (referred to hereinafter as "alignment system"), this mark can then be relocated each time a new layer has to be juxtaposed on an existing layer, and can be used as an alignment reference. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

For the sake of simplicity, the projection system may hereinafter be referred to as the "lens." However, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel or preparatory steps may be carried out on one or more tables while one or more other tables are being used for exposures. Dual stage lithographic apparatus are described, for example, in U.S. Pat. No. 5,969,441 and WO 98/40791.

Since no materials are known to date to be sufficiently transparent to EUV radiation, a lithographic projection apparatus employing EUV radiation is envisaged to employ a reflective mask having a multilayer coating of alternating layers of different materials, for instance, in the order of 50 periods of alternating layers of molybdenum and silicon or other materials, such as, for example, disclosed in European patent application EP 1 065 532 A. The size of the features to be imaged in EUV lithography makes the imaging process very sensitive to any contamination present on the mask. It is foreseen that any contaminant particles having a dimension in the order of 50 nm will result in defects present in devices fabricated in the substrate. Conventionally, the patterned side of the reticle is covered by a pellicle. Any contamination will then accumulate on the pellicle surface at some distance from the mask pattern and will therefore not be (sharply) imaged onto the substrate, making such masks having pellicles less sensitive to contamination. Pellicles cannot be employed for EUV radiation since they will not be sufficiently transparent to EUV radiation. Particle contamination on the pattern-bearing reflective surface of the mask would therefore lead to defective devices fabricated and must be prevented.

Further, the reflective mask is envisaged to be held at its backside on the mask table by electrostatic forces on a mask-bearing surface to be able to meet the very stringent requirements for EUV mask positioning. Any contaminant particles present in between the backside of the mask and the mask-bearing surface of the mask table will result in irregularities of the reflective mask surface. Since the projection system will be non-telecentric on the object side because a reflective mask is used (more information on this problem can be derived from European patent application EP 1 139 176 A), any irregularity in the surface figure of the reflective mask surface will translate into a local shift of the pattern imaged onto the substrate. As a result, the imaged layer may not line up with earlier layers that have been processed in the substrate, again leading to defective devices being fabricated. Therefore, particle contamination on the backside surface of the mask must be prevented.

Molecular type of contamination, such as hydrocarbons and water, should also be prevented. Such contamination will have a detrimental effect on any optical components in the lithographic apparatus, including the mask. In all handling procedures of masks and substrates, care should be taken that their surfaces will remain clean from such molecular contamination.

Masks and substrates may be stored and transported in between various types of apparatus employing a storage box in which a protective environment is maintained, such as an environment that is evacuated or filled with an inert gas. Inside walls of such a storage box should also remain clean. However, while transferring a mask or substrate out of such a storage box to an apparatus for processing or employing such substrate or mask, contamination, both particulate contamination and molecular contamination may be introduced onto the mask or substrate or internal walls of the protective environment. It is possible to transfer a mask or substrate through some intermediate chamber, for instance, a load lock chamber, to a final environment for processing or use, but then it may require very long times before such contamination is removed from the intermediate chamber, for instance, very long pump down times when the protective environment is to be evacuated.

SUMMARY OF THE INVENTION

It is an aspect of the present invention to provide a transferring method in which the introduction of contamination into a protective environment is largely reduced or even fully prevented.

This and other aspects are achieved according to the invention in a method for transferring one or more substrates or masks in a storage box to an apparatus for handling, processing or using the substrates or masks, the storage box including a cover having an openable cover part, the method including providing the storage box onto an openable wall part of a wall of an enclosed protective environment of the apparatus such that the openable cover part overlaps the openable wall part, the protective environment being adapted to be filled with an inert gas or to be evacuated; opening the openable cover part and the openable wall part, whereby the cover forms part of the wall and an inside of the storage box becomes part of the protective environment; and transferring at least one of the substrates or masks from an inside space of the storage box to an inside space of the protective environment, or vice versa.

According to further aspects of the present invention there are provided a storage box and an apparatus for use in the above method.

According to yet a further aspect of the present invention there is provided a device manufacturing method including providing a substrate that is at least partially covered by a layer of radiation-sensitive material; providing a projection beam of extreme ultraviolet radiation using a radiation system; using a reflective mask to endow the projection beam with a pattern in its cross-section so as to provide a patterned beam of radiation; projecting the patterned beam of radiation onto a target portion of the layer of radiation-sensitive material; and transferring one or more masks or substrates according to the above method.

Although specific reference may be made in this text to the use of the apparatus according to the present invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. One of ordinary skill will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass extreme ultra-violet (EUV) radiation (e.g. having a wavelength in the range 5–20 nm).

BRIEF DESCRIPTION OF THE DRAWINGS

Embodiments of the invention will now be described, by way of example only, with reference to the accompanying schematic drawings, in which corresponding reference symbols indicate corresponding parts, and in which:

FIG. 4 schematically depicts the storage box on the load lock chamber of FIG. 4, but with the mask lowered into the load lock chamber; and FIG. 5 schematically depicts a storage box and load lock chamber according to another embodiment of the present invention.

DETAILED DESCRIPTION

Figure 1:
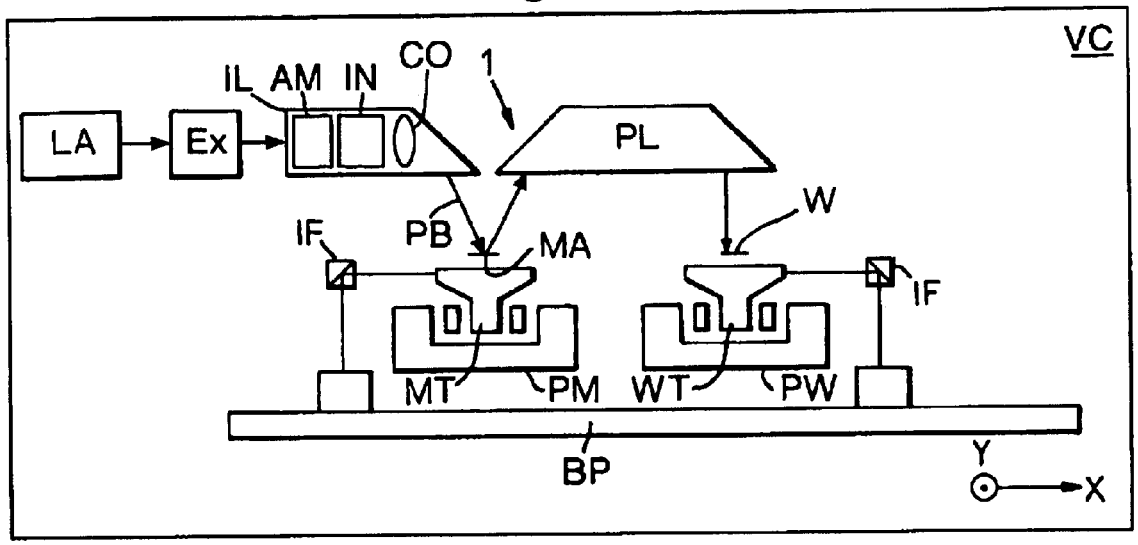
FIG. 1 schematically depicts a lithographic projection apparatus according to an embodiment of the invention.

FIG. 1 schematically depicts a lithographic projection apparatus 1 according to an embodiment of the invention. The apparatus 1 includes a base plate BP; a radiation system Ex, IL constructed and arranged to supply a projection beam PB of radiation (e.g. EUV radiation), which in this particular case also comprises a radiation source LA; a first object (mask) table MT provided with a mask holder constructed and arranged to hold a mask MA (e.g. a reticle), and connected to a first positioning device PM that accurately positions the mask with respect to a projection system or lens PL; a second object (substrate) table WT provided with a substrate holder constructed and arranged to hold a substrate W (e.g. a resist-coated silicon wafer), and connected to a second positioning device PW that accurately positions the substrate with respect to the projection system PL. The projection system or lens PL (e.g. a mirror group) is constructed and arranged to image an irradiated portion of the mask MA onto a target portion C (e.g. comprising one or more dies) of the substrate W.

As here depicted, the apparatus is of a reflective type (i.e. has a reflective mask). However, in general, it may also be of a transmissive type, for example with a transmissive mask. Alternatively, the apparatus may employ another kind of patterning device, such as a programmable mirror array of a type as referred to above.

The source LA (e.g. a discharge or laser-produced plasma source) produces a beam of radiation. This beam is fed into an illumination system (illuminator) IL, either directly or after having traversed a conditioning device, such as a beam expander Ex, for example. The illuminator IL may comprise an adjusting device AM that sets the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus, as is often the case when the source LA is a mercury lamp, for example, but that it may also be remote from the lithographic projection apparatus, the radiation beam which it produces being led into the apparatus (e.g. with the aid of suitable directing mirrors). This latter scenario is often the case when the source LA is an excimer laser. The present invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning device PW and interferometer IF, the substrate table WT can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step and scan apparatus) the mask table MT may just be connected to a short stroke actuator, or may be fixed. The mask MA and the substrate W may be aligned using mask alignment marks $M_1$, $M_2$ and substrate alignment marks $P_1$, $P_2$.

The depicted apparatus can be used in two different modes:

1. In step mode, the mask table MT is kept essentially stationary, and an entire mask image is projected at once, i.e. a single "flash," onto a target portion C. The substrate table WT is then shifted in the X and/or Y directions so that a different target portion C can be irradiated by the beam PB;

2. In scan mode, essentially the same scenario applies, except that a given target portion C is not exposed in a single "flash." Instead, the mask table MT is movable in a given direction (the so-called "scan direction", e.g., the Y direction) with a speed v, so that the projection beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Since EUV radiation will be largely absorbed by most gases and to provide a protective environment to the optical components used, the apparatus is largely contained in a vacuum environment VC, which generally will be divided into several sub-compartments.

Figure 2:
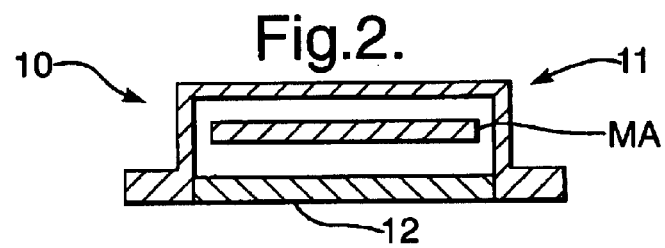
FIG. 2 schematically depicts a storage box in which a mask is stored.

FIG. 2 shows a mask storage box 10, in which an EUV reflective mask MA is stored for transportation, storage and handling purposes. The storage box 10 comprises a top part 11 and a bottom plate 12. The mask MA is held inside the storage box 10 on a bottom plate 12, for instance, by a kinematically-determined holding mechanism as disclosed in European patent application EP 01301864.3, incorporated herein by reference. Inside the storage box 10 an atmosphere of a protective (inert) gas may be maintained, for instance, at a pressure above ambient pressure. However, a vacuum may also be maintained inside the storage box 10. Especially in the latter case, a sufficient sealing is preferably provided in between the bottom plate 12 and the top part 11 to prevent gas flow in between the inside of the storage box 10 and its ambient environment and a resulting contaminated inside environment of the storage box 10.

Figure 3:
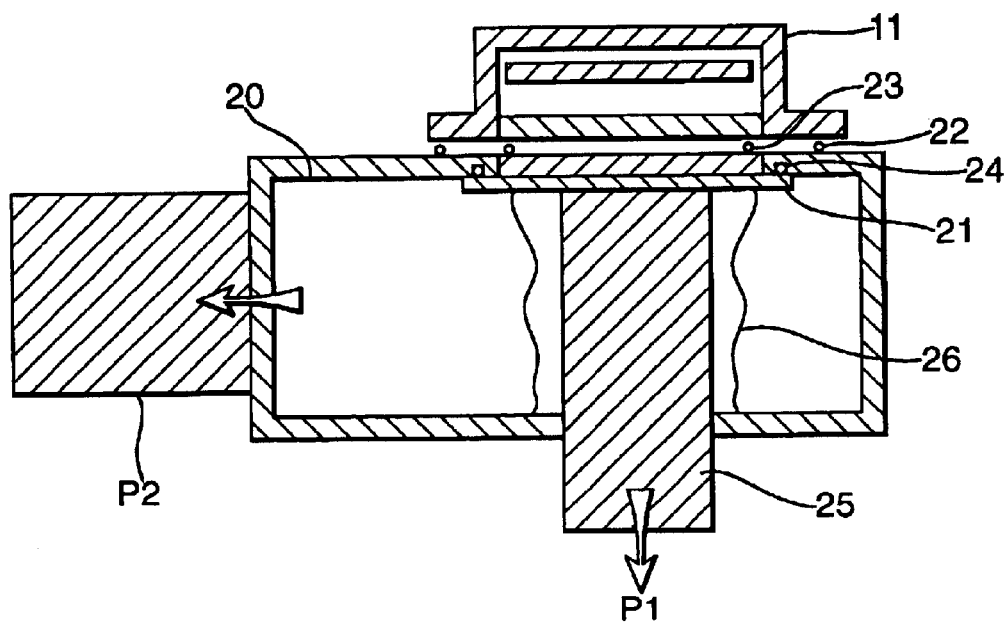
FIG. 3 schematically depicts a storage box on a load lock chamber that is attached to a vacuum chamber of the lithographic apparatus of FIG. 1.

To transfer the mask MA from the storage box 10 to the lithographic projection apparatus 1, the storage box 10 is put onto a load lock 20, shown in FIG. 3. The load lock 20 will be connected to the vacuum environment VC of the lithographic apparatus 1 by a valve 30, shown in FIGS. 4 and 5. The storage box 10 is positioned on the load lock 20 such that bottom plate 12 of the storage box 10 exactly overlaps with an openable top part 21 of the load lock 20. To this end a guiding mechanism (not shown) can be provided on the load lock 20 and/or the storage box 10 to properly align the storage box 10 and the openable top part 21 of the load lock 20. A clamping mechanism (not shown) is preferably provided to clamp the storage box 10 on the load lock 20 when storage box 10 is properly positioned. A seal 22 is provided between the storage box 10 and the load lock 20. The seal 22 is preferably provided very close to the bottom plate 12 and openable top part 21.

The bottom plate 12 of the storage box 10 and the openable top part 21 are now in contact with each other. The cross-sectional shapes of the bottom plate 12 and the openable top part 21 in a plane perpendicular to the drawing are made so as to have a substantially identical shapes. The shapes of contacting surfaces of both the bottom plate 12 and the openable top part 21 will therefore match. A seal 23 is preferable provided very close to the circumference in between the bottom plate 12 and the openable top part 21. A pump P1 is preferably provided to be able to evacuate the space in between the bottom plate 12 and the openable top part 21.

The openable top part 21 of the load lock 20 is provided on an elevator 25 for moving the openable top part 21 up and down. A seal 24 is provided for sealing the openable top part 21 against the upper wall of the load lock 20 when the openable top part 21 is moved fully upward against the upper wall so as constitute a part of the upper wall. A bellows 26 is provided around the elevator 25 and in between the openable top part 21 and a bottom wall of the load lock 20. The elevator 25 is connected to an appropriate drive (not shown) constructed and arranged to move the elevator up and down. Another pump P2 is provided for evacuating the load lock 20.

To transfer a mask MA in the mask storage box 10 into the load lock 20, first the mask MA is held inside its storage box 10. Care will have been taken that all inside walls of the storage box 10 are very clean so as not to contaminate the mask MA stored inside the storage box 10. Both particles and molecular contamination may make the mask useless for patterning the projection beam PB in the lithographic projection apparatus 1. As discussed above, a vacuum or an inert gas may be peovided inside the storage box 10.

The storage box 10 is then positioned over the openable top part 21 of the load lock 20 as described above. The contaminated outside surface of the bottom plate 12 will overlap the contaminated outside surface of the openable top part 21. The space in between will be evacuated through elevator 25 using vacuum pump P1.

Dependent on an evacuated or gas-filled space inside the storage box 10, transfer may proceed in various ways. If the storage box 10 is evacuated, it is preferable to first evacuate the load lock 20 using the pump P2 before opening the openable top part 21. If the storage box 10 is filled with a gas, transfer may proceed by also first evacuating the load lock 20, followed by gently or very suddenly opening the openable top part 21 by lowering the elevator 25. A gas flow out of the storage box 10 into the load lock 20 will then result, and a sudden gas flow and evacuation of the storage box 10 may help in removing particles that might be present on the mask MA so as to clean it. Another approach would be to first fill the load lock 20 with an (inert) gas followed by lowering the openable top part 21 and then evacuating the load lock 20 using the pump P2.

Care will also have been taken that all inside surfaces of the load lock 20 will be very clean. By proceeding as described above, the amount of contaminated surface area presented to the combined inside space of the load lock 20 and the storage box 10 is very limited. Such contaminated surfaces might introduce contamination onto the mask MA, but would also dramatically increase pump-down times to the partial pressures (for instance of water and hydrocarbons) required for EUV projection lithography.

FIG. 4 shows the mask MA lowered out of its storage box 10. The side valve 30 connects the load lock 20 to another part of the vacuum system of the projection apparatus 1. The valve 30 in its open position allows access to a gripper 40 to pick up the mask MA and transport it to an internal library, the mask table MT or any other location, as required. A gripper is disclosed in EP 01301864.3, referred to above.

For unloading the mask MA from the projection apparatus 1 into the storage box 10, the gripper 40 first puts the mask MA onto the bottom plate 12 that has been lowered by the elevator 25, while the inside spaces of the load lock 20 and the storage box 10 are evacuated. Subsequently, the valve 30 can be closed. The elevator 25 may then be raised to place the mask MA into the storage box 10 and to maintain an evacuated space inside the storage box 10 when the bottom plate 12 has closed the storage box 10. To have an atmosphere of a clean (inert) gas inside the storage box 10, the space of the load lock 20 and the storage box 10 is purged with such gas and subsequently the elevator 25 is raised to put the mask MA into its storage box 10 and to close it by putting the bottom plate 12 in place in the bottom part of the storage box 10.

FIG. 5 shows another embodiment of the present invention. A cover 50 is provided over the storage box 10 when located on the load lock 20. The storage box 10 may not be specifically designed to withstand a pressure induced when the inside of the storage box 10 is evacuated and the ambient environment of the storage box 10 is not. By providing the cover 50 over the storage box 10 and evacuating both the space inside the storage box 10 and the space in between the cover 50 and the storage box 10, there will be no or only a negligible pressure induced on the storage box 10. A pump P3 is provided to evacuate the space in between the cover 50 and top part 11 of the storage box 10.

The present invention has been described with respect to a lithographic projection apparatus as an example only. The present invention may also be employed with any other type of apparatus for handling a mask and in which a mask needs to be loaded from and unloaded into a storage box as described, such as a mask writing apparatus, a mask inspection apparatus, a multilayer deposition apparatus, a mask cleaning apparatus, etc. The storage box may contain more than one mask in a dedicated holder.

Further, the invention may also be employed in transferring substrates into and out of a storage box for substrates, such as semiconductor wafers processed or to be processed.

The protective environment to which the masks and/or masks are transferred need not be a vacuum environment, but may also be an environment filled with an inert gas, such as dry air, nitrogen, argon, etc.

While specific embodiments of the invention have been described above, it will be appreciated that the invention may be practiced otherwise than as described. The description is not intended to limit the invention.

What is claimed is:

1. A method for transferring one or more substrates or masks in a storage box to an apparatus for handling, processing or using the substrates or masks, the storage box being detachable from the apparatus and comprising a cover having an openable cover part, the method comprising:

providing the storage box onto an openable wall part of a wall of an enclosed protective environment of the apparatus such that the openable cover part overlaps the openable wall part, the protective environment being adapted to be filled with an inert gas or to be evacuated;

evacuating a space between the openable cover part and the openable wall part;

opening the openable cover part and the openable wall part, whereby the cover forms part of the wall and an inside of the storage box becomes part of the protective environment; and transferring at least one of the substrates or masks from an inside space of the storage box to an inside space of the wall of the protective environment, or vice versa.

2. A method according to claim 1, wherein the cover is sealingly provided onto the wall of the protective environment.

3. A method according to claim 1, wherein opposing outside surfaces of the openable cover part and the openable wall part are in contact while being opened jointly so as to at least substantially not expose the protective environment to outside surfaces of the cover of the storage box and the wall of the protective environment.

4. A method according to claim 3, wherein the opposing surfaces have substantially identical shapes.

5. A method according to claim 3, wherein the openable cover part and the openable wall part are sealed at their circumference so as to seal the evacuated space in between the opposing surfaces from the protective environment.

6. A method according to claim 1, wherein at least one of the substrates and the masks are for processing and use in a lithographic apparatus employing a projection beam of extreme ultraviolet radiation.

7. A storage box comprising a cover and an openable cover part wherein the storage box is adapted for use in a method according to claim 1.

8. An apparatus comprising a wall of an enclosed protective environment and an openable wall part disposed on said wall, wherein the apparatus is adapted for use in a method according to claim 1.

9. An apparatus according to claim 8, wherein the apparatus is a lithographic projection apparatus further comprising:

a radiation system for providing the projection beam of extreme ultraviolet electromagnetic radiation;

a mask table for holding the reflective mask, the mask serving to pattern the projection beam according to a desired pattern upon reflection of the projection beam at the mask so as to yield a patterned projection beam;

a substrate table for holding a substrate; and a projection system for projecting the patterned projection beam onto a target portion of the substrate.

10. A device manufacturing method, comprising:

providing a substrate that is at least partially covered by a layer of radiation-sensitive material;

providing a projection beam of extreme ultraviolet radiation using a radiation system;

using a reflective mask to endow the projection beam with a pattern in its cross-section so as to provide a patterned beam of radiation;

projecting the patterned beam of radiation onto a target portion of the layer of radiation-sensitive material; and transferring one or more masks or substrates according to a method according to claim 1.

11. A method according to claim 1, further comprising evacuating the protective environment before opening the openable wall part.

12. A method according to claim 11, wherein the evacuating of the protective environment and the evacuating of the space between the openable cover part and the openable wall part are performed by different pump systems.

13. A method according to claim 1, further comprising enclosing the cover of the storage box with a protective cover after providing the storage box onto the openable wall part.

14. A method according to claim 13, further comprising evacuating a space comprised between the protective cover and the cover of the storage box.

15. An apparatus according to claim 8, wherein the apparatus is one of a mask writing apparatus, a mask inspection apparatus, a multilayer deposition apparatus and a mask cleaning apparatus.

* * * * *